United States Patent
Wang

(10) Patent No.: US 7,087,350 B2
(45) Date of Patent: Aug. 8, 2006

(54) METHOD FOR COMBINING VIA PATTERNS INTO A SINGLE MASK

(75) Inventor: Hsiang Wei Wang, Hsin Chu (TW)

(73) Assignee: Taiwan Semiconductor Manufacturing Co. Ltd., Hsin-Chu (TW)

(*) Notice: Subject to any disclaimer, the term of this patent is extended or adjusted under 35 U.S.C. 154(b) by 157 days.

(21) Appl. No.: 10/720,887

(22) Filed: Nov. 24, 2003

(65) Prior Publication Data
US 2005/0110146 A1 May 26, 2005

(51) Int. Cl.
G01F 9/00 (2006.01)
(52) U.S. Cl. .......................................... 430/5
(58) Field of Classification Search .............. 430/5, 430/311, 394; 716/19–21
See application file for complete search history.

(56) References Cited

U.S. PATENT DOCUMENTS

| | | | |
|---|---|---|---|
| 5,663,599 A | 9/1997 | Lur | |
| 5,675,187 A | 10/1997 | Numata et al. | |
| 6,109,775 A | 8/2000 | Tripathi et al. | |
| 6,355,563 B1 | 3/2002 | Cha et al. | |
| 6,487,712 B1* | 11/2002 | Kim | 716/21 |
| 6,492,259 B1 | 12/2002 | Dirahoui et al. | |
| 2003/0044059 A1* | 3/2003 | Chang et al. | 382/149 |

* cited by examiner

Primary Examiner—S. Rosasco
(74) Attorney, Agent, or Firm—Duane Morris LLP

(57) ABSTRACT

In a damascene process of fabricating an interconnect structure in an integrated circuit, a method for removing separate via layers is disclosed herein, which includes combining the via layers into a single mask.

2 Claims, 1 Drawing Sheet

METHOD FOR COMBINING VIA PATTERNS INTO A SINGLE MASK

FIELD OF THE INVENTION

The present invention relates to integrated circuit fabrication generally, and more specifically to dual damascene methods.

BACKGROUND OF THE INVENTION

The advances of semiconductor manufacturing technology have led to continuous increases in the operating speed, and consequent decreases in the size of integrated circuits. An integrated circuit, comprising many electronic components such as transistors and capacitors, is typically formed by multiple levels with interconnects. Patterned conductive material on one level is electrically insulated from patterned conductive material on another level by an insulating layer made of dielectric material. Each level may include lines and patterns of various shapes and sizes. Different levels are vertically integrated and electrically connected with each other by structures often referred to as vias.

In order to increase the operating speed of integrated circuits while reducing power consumption, conductive material with a lower electrical resistance, such as copper, is used. However, copper is difficult to etch in a semiconductor environment. As a result, a damascene approach is used, which comprises etching trenches and vias in the insulating layer and subsequently filling the trenches and vias with conductive material, such as copper. The conductive material is then polished down to the surface of the insulating layer by, for example, chemical mechanical polishing (CMP) to form the desired metal pattern. The damascene process is advantageous because: (1) it is easier to control the dimensions and registration of etched lines in the dielectric material than controlling the etching of lines in copper, and (2) it is easier to make a planar surface by polishing the copper rather than by planarizing the dielectric.

In a typical via-first sequence, a mask is used to etch a via through two layers of dielectric between conductor layers. A trench that is wider than the via is then etched through the top one of the two layers. In order to prevent the trench-etching step from etching through the underlying etch stop (e.g., nitride) layer and eroding the conductive line beneath the via, a photoresist plug is inserted in the via before the trench is etched. The trench mask is aligned with the via and the trench is etched.

However, the introduction of the via plug creates a problem, which has been observed in 0.13 um copper technology fabrication. If the photoresist plug is too low, a via facet occurs. The facet is a widening of the via at the top of the lower one of the two dielectric layers, caused by erosion of the via wall near the top of the lower layer. The facet is unacceptable, because, for example, it causes poor deposition of the TaN barrier layer and copper film in the trench. In order to avoid these problems, it would be desirable to combine various layers, without reducing process efficiencies. The contact area would not be appropriate to combine, due to the fact that cell size might be enlarged as a result.

SUMMARY OF THE INVENTION

In a damascene process of fabricating an interconnect structure in an integrated circuit, a method for removing separate via layers is disclosed herein, which comprises combining the via layers into a single mask. Specifically, the present invention relates to a via/contact photomask, comprising a first via/contact pattern serving for forming at least one first functional via/contact plug and a second via/contact pattern serving for forming at least one first dummy via/contact plug within a first dielectric layer, and the first via/contact pattern serving for forming at least one second dummy via/contact plug and the second via/contact pattern serving for forming at least one second functional via/contact plug within a second dielectric layer.

DETAILED DESCRIPTION OF THE INVENTION

Figure 1:
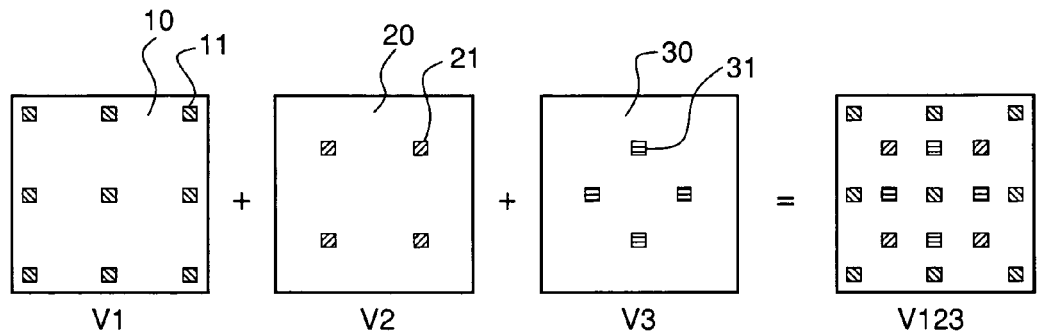
FIG. 1 is a top view diagram of separate masks, and the resulting combined mask of the present invention.

The description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

Note that the via/contact photomask as described above may further comprise a third via/contact pattern serving for forming at least one third functional via/contact plug in a third dielectric layer. The via/contact photomask may be applied in two consecutive via/contact photolithographic processes.

The present invention also relates to a structure of interconnection between two metals within an integrated circuit, comprising: a first metal pattern comprising a first metal structure and a second metal structure; a first via/contact plug on the first metal structure of the first metal pattern and a second via/contact plug on the second metal structure of the first metal pattern; and a second metal pattern comprising a first metal structure on the first via/contact plug and a second metal structure on the second via/contact plug, wherein the first metal structures of the first and second metal patterns are functional, and at least one of the second metal structures of the first and second metal patterns is dummy. The first and second via/contact plugs may be formed by utilizing a via/contact photomask which comprises a first via/contact pattern serving for forming the first via/contact plug and a second via/contact pattern serving for forming the second via/contact plug. The first metal structures of the first and second metal patterns may be metal lines, and the at least one of the second metal structures of the first and second metal patterns may be a metal island.

The present invention further relates to a method of forming interconnection within an integrated circuit, comprising: forming a first dielectric layer over a first metal pattern formed on a substrate, the first dielectric layer having first via/contact plugs therein formed by using a via/contact photomask for patterning first via/contact holes; forming a second metal pattern over the first dielectric layer and on the first via/contact plugs; and forming a second dielectric layer over the second metal pattern, the second dielectric layer having second via/contact plugs therein formed by using the via/contact photomask for patterning second via/contact holes. As noted above, the via/contact photomask comprises a first via/contact pattern serving for forming the first via/contact plugs within the first dielectric layer and the second via/contact pattern serving for forming the second via/contact plugs within the second dielectric layer.

Figure 2:
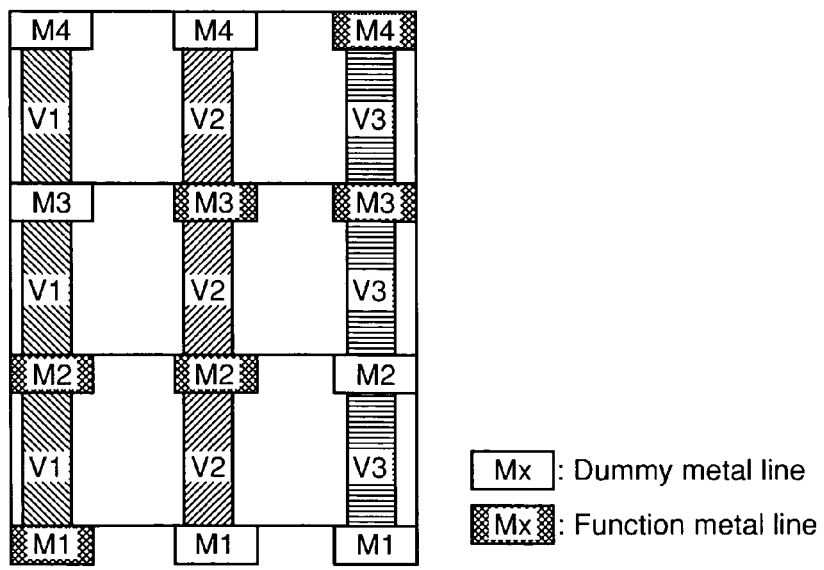
FIG. 2 is a cross section diagram of three vias on a silicon wafer in accordance with the present invention.

FIG. 1 is a top view diagram of separate masks, and the resulting combined mask. FIG. 2 is a cross section diagram (viewed from top to bottom) of FIG. 1. Note that the present invention may be used in technologies such as 0.13 um copper, for example, but is not limited thereto, and may be used with other damascene technologies and geometries.

Process efficiencies are achieved by the present invention, in that a single mask may be utilized in the fabricating of an interconnect structure in an integrated circuit.

Referring again to FIG. 1, there are shown top views of masks 10, 20 and 30 (V1, V2 and V3, respectively), with associated vias, indicated by 11, 21 and 31 respectively. Combined mask V123 is also shown in FIG. 1.

Referring to FIG. 2, this cross-section diagram is represented by choosing any three vias on the silicon wafer processed by the V123 mask as shown in FIG. 1, and cutting the center of those three vias from top to bottom. One may consider the left via/metal string (M1/V1/M2/V1/M3/V1/M4) in FIG. 2 as an example. M1/V1/M2 is the connect with electrical function, which signifies that the M1 and M2 lines will extend to where they need to connect in order to function properly. However, continuing on the left via/metal string, V1/M3/V1/M4 has no electrical function at all; the M3 and M4 here are only a small island. The same principles apply to the middle and right strings in FIG. 2. The "shaded M" signifies the real electrical function metal lines. The "non-shaded M" signifies non-electrical function metal islands (dummy metal lines). The non-electrical metal island functions as a metal line contact with the two extra "no-function V1s" as shown in FIG. 2.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A via/contact photomask, comprising a first via/contact pattern serving for forming at least one first functional via/contact plug and a second via/contact pattern serving for forming at least one first dummy via/contact plug within a first dielectric layer, and the first via/contact pattern serving for forming at least one second dummy via/contact plug and the second via/contact pattern serving for forming at least one second functional via/contact plug within a second dielectric layer, wherein the via/contact photomask further comprises a third via/contact pattern serving for forming at least one third functional via/contact plug in a third dielectric layer.

2. The via/contact photomask of claim 1, wherein the via/contact photomask is applied in two consecutive via/contact photolithographic processes.

* * * * *